United States Patent
Ikimura

(10) Patent No.: US 8,526,148 B2
(45) Date of Patent: Sep. 3, 2013

(54) SEMICONDUCTOR DEVICE, DC-DC CONVERTER, AND PROTECTIVE ELEMENT

(75) Inventor: Takehito Ikimura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 13/224,215

(22) Filed: Sep. 1, 2011

(65) Prior Publication Data

US 2012/0262827 A1 Oct. 18, 2012

(30) Foreign Application Priority Data

Apr. 13, 2011 (JP) .................. 2011-089083

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl.
USPC ............................ 361/56; 361/118

(58) Field of Classification Search
None
See application file for complete search history.

(56) References Cited

U.S. PATENT DOCUMENTS

| 5,523,632 | A | 6/1996 | Seragnoli |
| 7,651,917 | B2 | 1/2010 | Kaneko |
| 2012/0139005 | A1* | 6/2012 | Ikimura et al. ................. 257/139 |

FOREIGN PATENT DOCUMENTS

JP 2009-076761 4/2009

* cited by examiner

*Primary Examiner* — Dharti Patel
(74) *Attorney, Agent, or Firm* — Patterson & Sheridan, LLP

(57) ABSTRACT

A semiconductor device includes a first interconnect connected to a high voltage side power supply voltage, a second interconnect connected to the high voltage side power supply voltage, a switching transistor, and a protective element connected in parallel with the switching transistor between the high voltage side power supply voltage and a low voltage side power supply voltage. A first end of the switching transistor is connected to the first interconnect, and a second end is connected to an output terminal. The protective element includes a first p-type semiconductor region connected to the first interconnect, an n-type semiconductor region in contact with the first p-type semiconductor region and connected to the second interconnect, and a second p-type semiconductor region in contact with the n-type semiconductor region, spaced from the first p-type semiconductor region, and connected to the low voltage side power supply voltage.

20 Claims, 9 Drawing Sheets

US 8,526,148 B2

SEMICONDUCTOR DEVICE, DC-DC CONVERTER, AND PROTECTIVE ELEMENT

CROSS-REFERENCE TO RELATED APPLICATIONS

This application is based upon and claims the benefit of priority from the prior Japanese Patent Application No. 2011-089083, filed on Apr. 13, 2011; the entire contents of which are incorporated herein by reference.

FIELD

Embodiments described herein relate generally to a semiconductor device, a DC-DC converter and a protective element.

BACKGROUND

In the past, protective elements have been developed for protecting integrated circuits from electrostatic discharge (ESD). Most of this type of protective elements were connected in parallel with the integrated circuit, between the power supply interconnect and the ground wiring, with the breakdown voltage set lower than the breakdown voltages of the elements in the integrated circuit. In this way when a high voltage is applied to the power supply interconnect due to ESD or the like, the protective element will break down before the elements in the integrated circuit will do, allowing the current to flow and protecting the integrated circuit.

DETAILED DESCRIPTION

In general, according to one embodiment, a semiconductor device includes a first interconnect configured to connect a high voltage side power supply voltage, a second interconnect being separated from the first interconnect, configured to connect the high voltage side power supply voltage, a switching transistor with a first end being connected to the first interconnect, and a second end being connected to an output terminal, and a protective element being connected in parallel with the switching transistor between the high voltage side power supply voltage and a low voltage side power supply voltage. The protective element includes a first p-type semiconductor region being connected to the first interconnect, an n-type semiconductor region in contact with the first p-type semiconductor region and being connected to the second interconnect, and a second p-type semiconductor region in contact with the n-type semiconductor region, being spaced from the first p-type semiconductor region, and being connected to a interconnect configured to connect the low voltage side power supply voltage.

Hereinafter, embodiments of the invention will be explained below with reference to the drawings.

First, a first embodiment will be explained.

Figure 1:
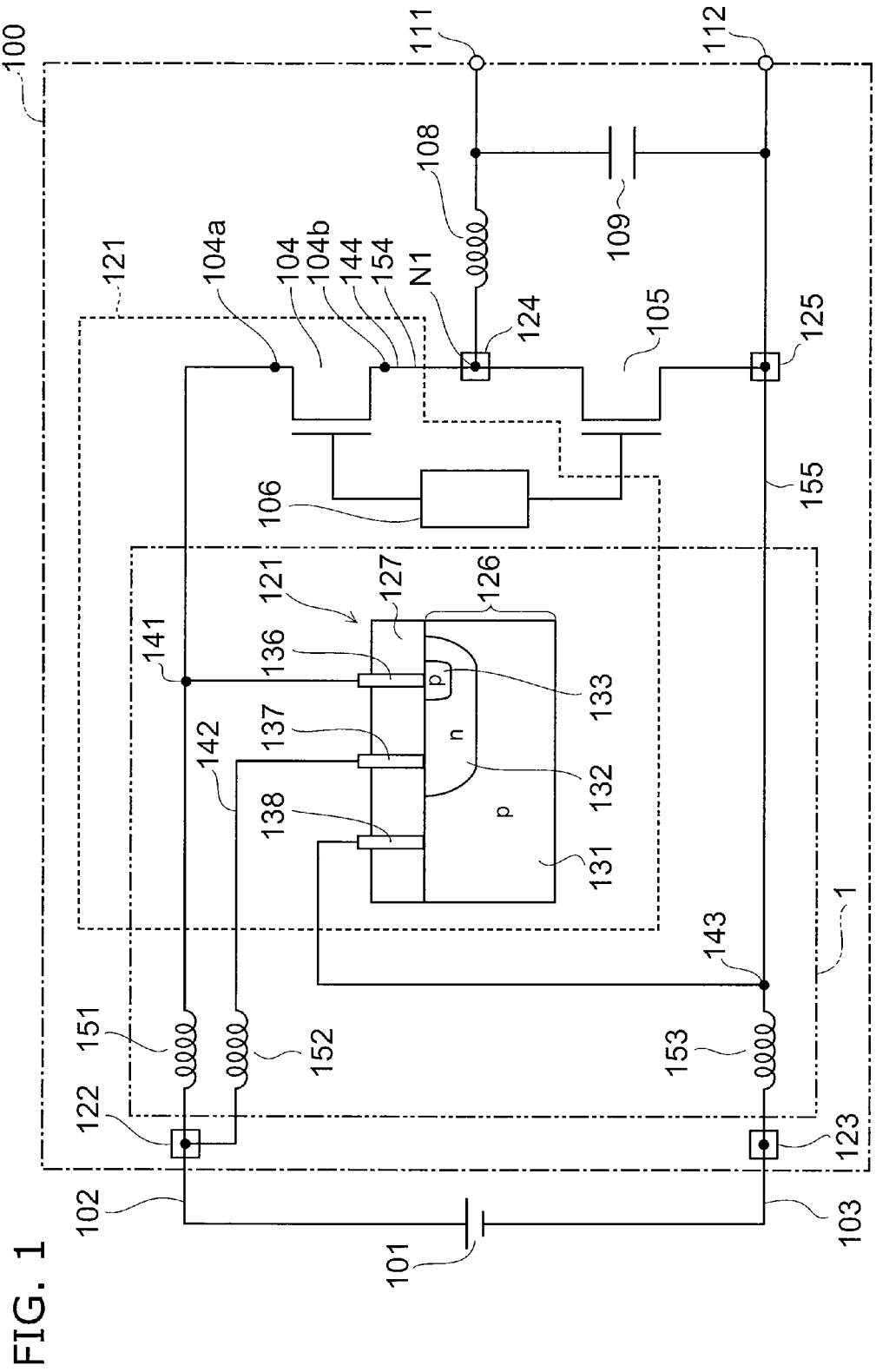
FIG. 1 is a schematic circuit diagram illustrating a semiconductor device according to a first embodiment.
Figure 2:
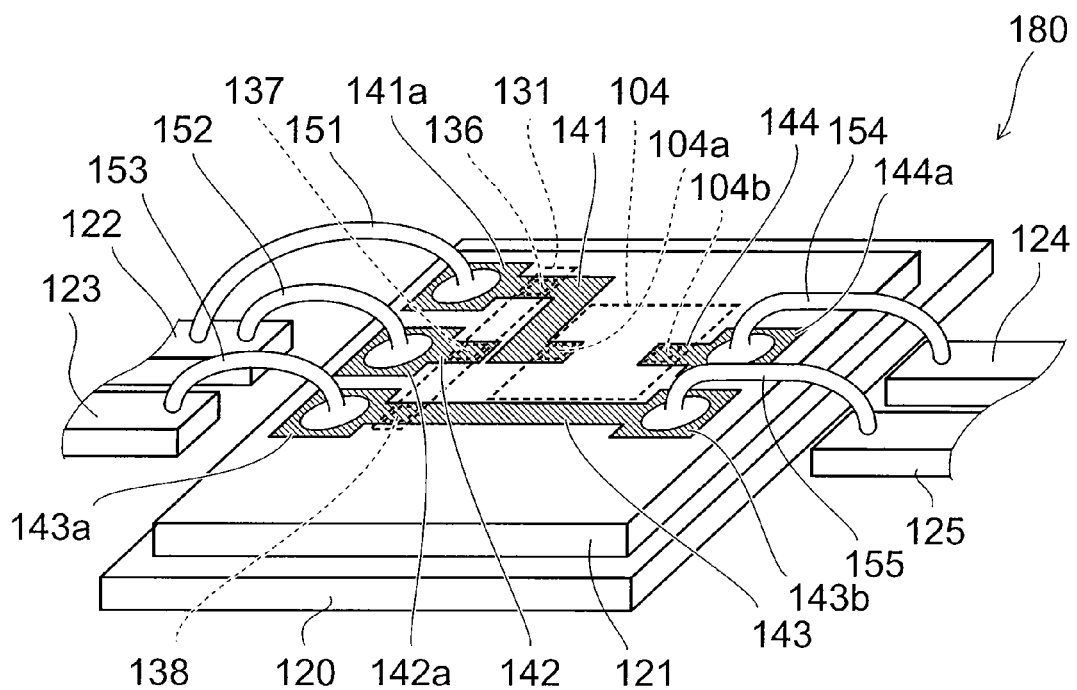
FIG. 2 is a perspective view illustrating a part of the semiconductor device according to the first embodiment.
Figure 3:
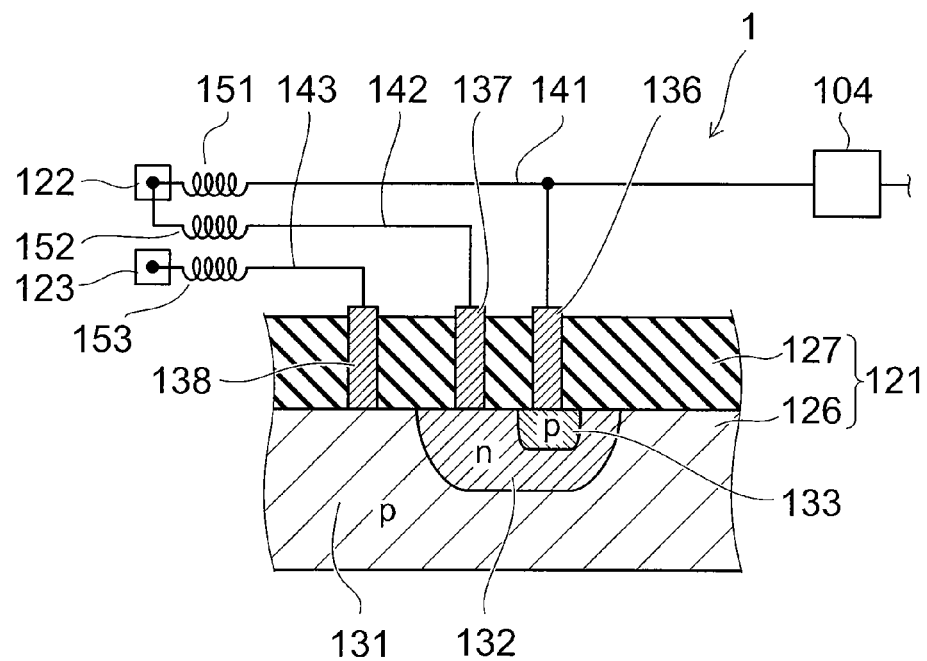
FIG. 3 is a schematic cross-sectional view illustrating a protective element according to the first embodiment.

FIG. 1 is a schematic circuit diagram illustrating a semiconductor device according to the embodiment;

FIG. 2 is a perspective view illustrating a part of the semiconductor device according to the embodiment; and FIG. 3 is a schematic cross-sectional view illustrating a protective element according to the embodiment.

As illustrated in FIG. 1, a semiconductor device 100 according to the embodiment is a DC-DC converter. In the semiconductor device 100, a protective element 1 is connected between a high voltage side power supply interconnect 102 and a low voltage side power supply interconnect 103 of an external direct current power supply 101. In the following, the positive polarity voltage of the external direct current power supply 101, in other words, the voltage of the high voltage side power supply interconnect 102 is referred to as a "high voltage side power supply voltage", and the negative polarity voltage of the external direct current power supply 101, in other words, the voltage of the low voltage side power supply interconnect 103 is referred to as a "low voltage side power supply voltage". The low voltage side power supply voltage is, for example, the ground voltage.

Between the power supply interconnect 102 and the power supply interconnect 103, a high side transistor 104 and a low side transistor 105 are connected in series. Both the high side transistor 104 and the low side transistor 105 are field effect transistors, and control voltage output from a control circuit 106 is supplied to their respective gates. As a result the high side transistor 104 and the low side transistor 105 are alternately turned on and off, and the voltage of a node N1 between the high side transistor 104 and the low side transistor 105 varies periodically. In other words, the high side transistor 104 and the low side transistor 105 each operate as a switching circuit that changes whether or not the high voltage side power supply interconnect 102 is connected to the low voltage side power supply voltage 103.

An inductor 108 is connected between the node N1 and a high voltage side output terminal 111 of the semiconductor device 100. Also, a low voltage side output terminal 112 of the semiconductor device 100 is connected to the low voltage side power supply interconnect 103 of the external direct current power supply 101. A capacitor 109 is connected between the high voltage side output terminal 111 and the low voltage side output terminal 112. In this way the periodically varying voltage of the node N1 is smoothed by the LC circuit formed by the inductor 108 and the capacitor 109, so a substantially constant direct current is output from the high voltage side output terminal 111 and the low voltage side output terminal 112. At this time, the control circuit 106 controls the voltage output from the output terminals 111 and 112 by controlling a ratio of the high side transistor 104 when on and the low side transistor 105 when on. Also, the protective element 1 is connected between the high voltage side power supply interconnect 102 and the low voltage side power supply voltage 103 in parallel with the circuit that includes the high side transistor 104 and the low side transistor 105, to protect this circuit. In other words, the protected circuit that is protected by the protective element 1 is formed from the high side transistor 104 and the low side transistor 105, which is a circuit that is a part of a DC-DC converter.

As illustrated in FIG. 2, a mounting substrate 120 is provided in the semiconductor device 100, and an integrated circuit die 121 is mounted on the mounting substrate 120. In the integrated circuit die 121, a silicon substrate 126 (see FIG. 1) and an inter-layer insulating film 127 (see FIG. 1) are provided. The inter-layer insulating film 127 is provided on the silicon substrate 126. Also, a part of the protective element 1 and the high side transistor 104 and the control circuit 106 (FIG. 1) are formed in the integrated circuit die 121. Also, lead pins 122 through 125 are provided in the semiconductor device 100. The lead pin 122 is connected to the high voltage side power supply interconnect 102 (see FIG. 1). The lead pin 123 is connected to the low voltage side power supply interconnect 103 (see FIG. 1). The lead pin 124 corresponds to the node N1 (see FIG. 1) on the circuit diagram, and is connected to the inductor 108 (see FIG. 1). The lead pin 125 is connected to the low voltage side output terminal 112 (see FIG. 1).

As illustrated in FIGS. 1 through 3, in the protective element 1, a p-type well 131 with p-type conductivity is formed in a top layer portion of the silicon substrate 126. In this way a p-type region is formed in the silicon substrate 126. The whole silicon substrate 126 may also be p-type. Also, an n-type region 132 is formed in a portion of the top layer of the p-type well 131. In other words, the n-type region 132 is formed in the silicon substrate 126, is surrounded by the p-type well 131, and is in contact with the p-type well 131. A p-type region 133 is formed in a portion of the top layer portion of the n-type region 132. In other words, the p-type region 133 is formed in the silicon substrate 126, is surrounded by the n-type region 132, and is in contact with the n-type region 132. The p-type region 133 is separated from the p-type well 131, with the n-type region 132 interposed between the p-type well 131 and the p-type region 133.

An anode electrode 136, a cathode electrode 137, and a sub-electrode 138 are provided in the inter-layer insulating film 127. A bottom end of the anode electrode 136 is connected to the p-type region 133, a bottom end of the cathode electrode 137 is connected to the n-type region 132, and the bottom end of the sub-electrode 138 is connected to the p-type well 131.

A top layer interconnect 141 to 144 is formed in the top surface of the inter-layer insulating film 127. One end of the top layer interconnect 141 is formed as a bonding pad 141a, a middle portion is connected to the top end of the anode electrode 136, and the other end is connected to one terminal 104a of the high side transistor 104. One end of the top layer interconnect 142 is formed as a bonding pad 142a, and the other end is connected to the top end of the cathode electrode 137. One end of the top layer interconnect 143 is formed as a bonding pad 143a, the middle portion is connected to the top end of the sub-electrode 138, and the other end is formed as a bonding pad 143b. One end of the top layer interconnect 144 is connected to the other terminal 104b of the high side transistor 104, and the other end is formed as a bonding pad 144a.

In the protective element 1, conductive wires 151, 152, 153 made from metal, for example, are provided. In FIG. 1, the wires 151, 152, 153 are shown as inductors. One end of the wire 151 is bonded to the lead pin 122, and the other end is bonded to the bonding pad 141a. One end of the wire 152 is bonded to the lead pin 122, and the other end is bonded to the bonding pad 142a. In the lead pin 122, for example the wire 152 is connected on the external direct current power supply 101 side of the wire 151. However, the wire 151 may be connected on the external direct current power supply 101 side of the wire 152. One end of the wire 153 is bonded to the lead pin 123, and the other end is bonded to the bonding pad 143a.

Also, wires 154 and 155 are provided in the semiconductor device 100. One end of the wire 154 is bonded to the bonding pad 144a, and the other end is bonded to the lead pin 124. One end of the wire 155 is bonded to the bonding pad 143b, and the other end is bonded to the lead pin 125.

In this way the high voltage side power supply voltage output from the external direct current power supply 101 is applied to the wire 151 and the wire 152 via the common lead pin 122. The low voltage side power supply voltage output from the external direct current power supply 101 is applied to the wire 153 and the wire 155 via the lead pin 123. When the high side transistor 104 is in the on state, the high voltage side power supply voltage is applied to the wire 154 via the high side transistor 104, and when the low side transistor 105 is in the on state, the low voltage side power supply voltage is applied via the low side transistor 105. The protective element 1 according to the embodiment is formed from the p-type well 131, the n-type region 132, the p-type region 133, the anode electrode 136, the cathode electrode 137, the sub-electrode 138, the top layer interconnect 141, 142, 143, and the wire 151, 152, 153. Also, the part that includes the integrated circuit die 121 to which is added the wires 151 to 155 as illustrated in FIG. 2, in other words, the part that includes the protective element 1 and the integrated circuit die 121 as illustrated in FIG. 1, forms a semiconductor package 180.

Next, the operation of the embodiment will be explained.

Figure 4A:
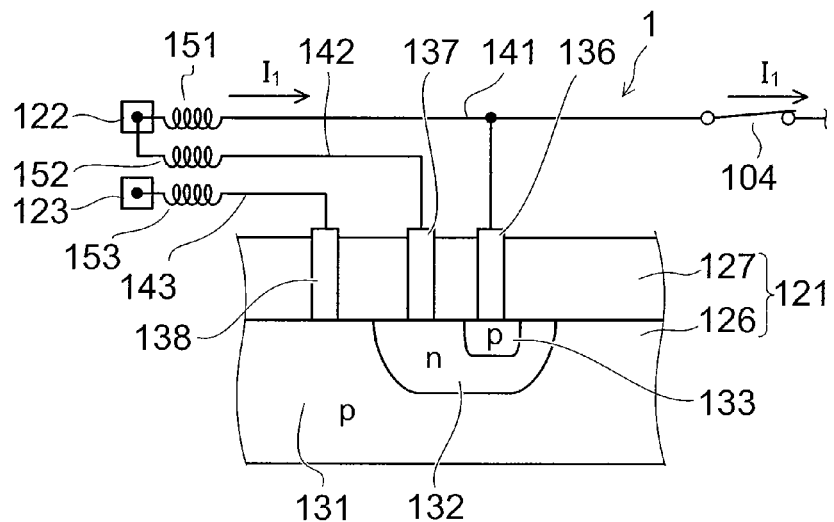
FIGS. 4A to 4C illustrate an operation of the protective element according to the first embodiment.
Figure 4B:
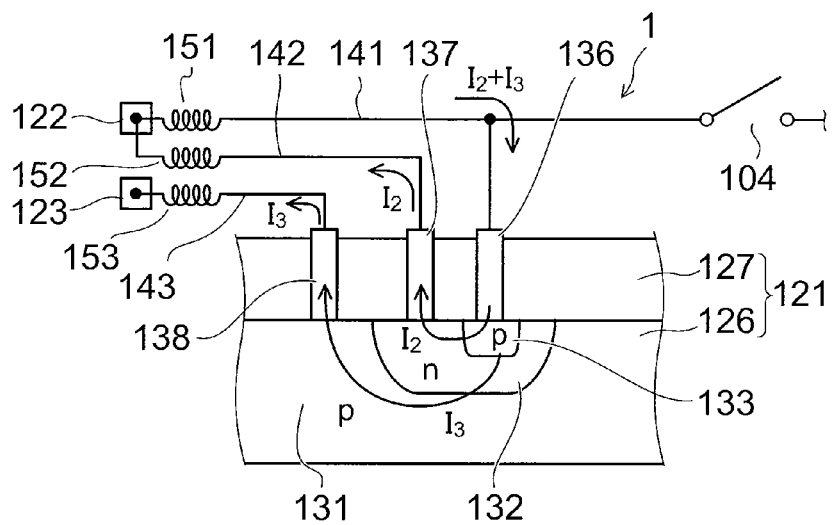
Figure 4C:
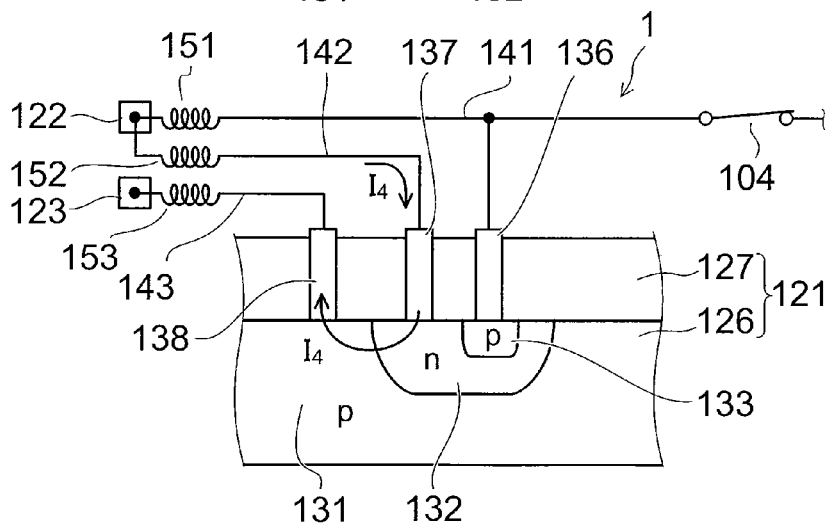

FIGS. 4A to 4C illustrate examples of the operation of the protective element according to the embodiment, FIG. 4A illustrates the case where the high side transistor is in the on state, FIG. 4B illustrates the case where the high side transistor has transitioned from the on state to the off state, and FIG. 4C illustrates the case where an ESD is applied.

In FIGS. 4A to 4C, the high side transistor 104 is indicated as a switch.

As stated above, in the semiconductor device 100 according to the embodiment, operation as a DC-DC converter is realized by alternating over short periods the state in which the high side transistor 104 is on and the low side transistor 105 is off, and the state in which the high side transistor 104 is off and the low side transistor 105 is on. At this time, the switching circuit of the high side transistor 104 and the low side transistor 105 repeatedly switches on/off at high frequency.

As illustrated in FIG. 4A, when the high side transistor 104 is in the on state, current $I_1$ flows from the external direct current power supply 101 via the high voltage side power supply interconnect 102, the lead pin 122, the wire 151, and the top layer interconnect 141 to the high side transistor 104. On the other hand, the same voltage (the high voltage side power supply voltage) is applied to the wire 151 and the wire 152 via the common lead pin 122, so the potential of the p-type region 133 and the n-type region 132 are equal, so current does not flow between the p-type region 133 and the n-type region 132. Therefore current does not flow in the wire 152. Also, the low voltage side power supply voltage is applied to the p-type well 131 from the external direct current power supply 101, via the low voltage side power supply interconnect 103, the lead pin 123, the wire 153, and the sub-electrode 138, so a reverse bias voltage is applied to an interface of the n-type region 132 and the p-type well 131. The withstand voltage of the interface of the n-type region 132 and the p-type well 131 is set higher than the reverse bias voltage, so current does not flow between the n-type region 132 and the p-type well 131. Therefore current does not flow in the wire 153.

As illustrated in FIG. 4B, when the high side transistor 104 transitions from the on state to the off state, the potential of the top layer interconnect 141 is higher than the potential of the high voltage side power supply voltage due to the inductance of the wire 151. As a result the potential of the p-type region 133 is higher than the potential of the n-type region 132, and a forward voltage is applied to the interface between the two regions, so the current $I_2$ flows from the p-type region 133 to the n-type region 132. The current $I_2$ is feedback current that flows subsequently in a loop through the path: the wire 151, the top layer interconnect 141, the anode electrode 136, the p-type region 133, the n-type region 132, the cathode electrode 137, the top layer interconnect 142, the wire 152, the lead pin 122, and the wire 151.

As a result of the current $I_2$ flowing, the potential of the base (n-type region 132) of the parasitic pnp transistor formed from the p-type region 133, the n-type region 132, and the p-type well 131 is lowered, and this parasitic pnp transistor is turned on. Specifically, as a result of the current $I_2$ flowing, a diffusion current is produced by the movement of electrons and electron holes between the p-type region 133 and the n-type region 132, and a part of the electron hole current generated flows into the p-type well 131, which is at a lower potential, and is discharged into the negative electrode of the external direct current power supply 101. As a result the current $I_3$ flows subsequently through the path: the wire 151, the top layer interconnect 141, the anode electrode 136, the p-type region 133, the n-type region 132, the p-type well 131, the sub-electrode 138, the top layer interconnect 143, the wire 153, the lead pin 123, the interconnect 103, and the external direct current power supply 101. The current $I_3$ is generated by the energy of electron holes generated at the interface of the p-type region 133 and the n-type region 132 moving to the p-type well 131 due to the potential of the p-type region 133 being higher than the potential of the n-type region 132 by, for example, 0.2 V. As a result of the current $I_2$ and $I_3$ flowing, the energy accumulated in the inductance of the wire 151 is eliminated.

As illustrated in FIG. 4C, when a surge current $I_4$ is applied to the high voltage side power supply interconnect 102 due to ESD or the like, the surge current $I_4$ flows into the n-type region 132 via the lead pin 122, the wire 152, the top layer interconnect 142, and the cathode electrode 137. Also, it is applied to the p-type region 133 via the lead pin 122, the wire 151, the top layer interconnect 141, and the anode electrode 136. As a result the potential of the p-type region 133 and the n-type region 132 are equal, so current does not flow between the p-type region 133 and the n-type region 132. However, a reverse bias voltage is applied between the n-type region 132 and the p-type well 131, and if this reverse bias voltage exceeds the withstand voltage of the pn interface of the n-type region 132 and the p-type well 131 avalanche breakdown occurs at this pn interface, and breakdown current flows. As a result the surge current $I_4$ flows subsequently through the path: the interconnect 102, the lead pin 122, the wire 152, the top layer interconnect 142, the cathode electrode 137, the n-type region 132, the p-type well 131, the sub-electrode 138, the top layer interconnect 143, the wire 153, the lead pin 123, and the interconnect 103, and the energy is dissipated. As a result, the current flowing in the high side transistor 104 and the low side transistor 105 is small, and these transistors are protected.

Next, the effect of the embodiment will be explained.

As explained with reference to FIG. 4C, according to the embodiment, when a surge current is applied to the semiconductor device 100 due to ESD or the like, avalanche breakdown occurs in the protective element 1, so the high side transistor 104 and the low side transistor 105 are protected. In this way it is possible to protect the circuit against transient and low frequency stresses.

Also, as explained with reference to FIG. 4B, when the switching circuit included in the circuit to be protected, in other words the high side transistor 104, has transitioned from the on state to the off state, the current $I_2$ flows as a pn interface forward current, and the current $I_3$ flows as the on current of the parasitic pnp transistor, so the energy accumulated in the inductance of the wire 151 is discharged. At this time current flows without producing avalanche breakdown in the protective element 1, so the protective element 1 is not damaged. As a result, even if the high side transistor 104 repeatedly turns on and off at high frequency, the protective element 1 will not degrade. Also, it is not necessary to have a predetermined withstand voltage between the p-type region 133 and the n-type region 132, so a size of the protective element 1 can be reduced.

Next, a second embodiment will be explained.

Figure 5:
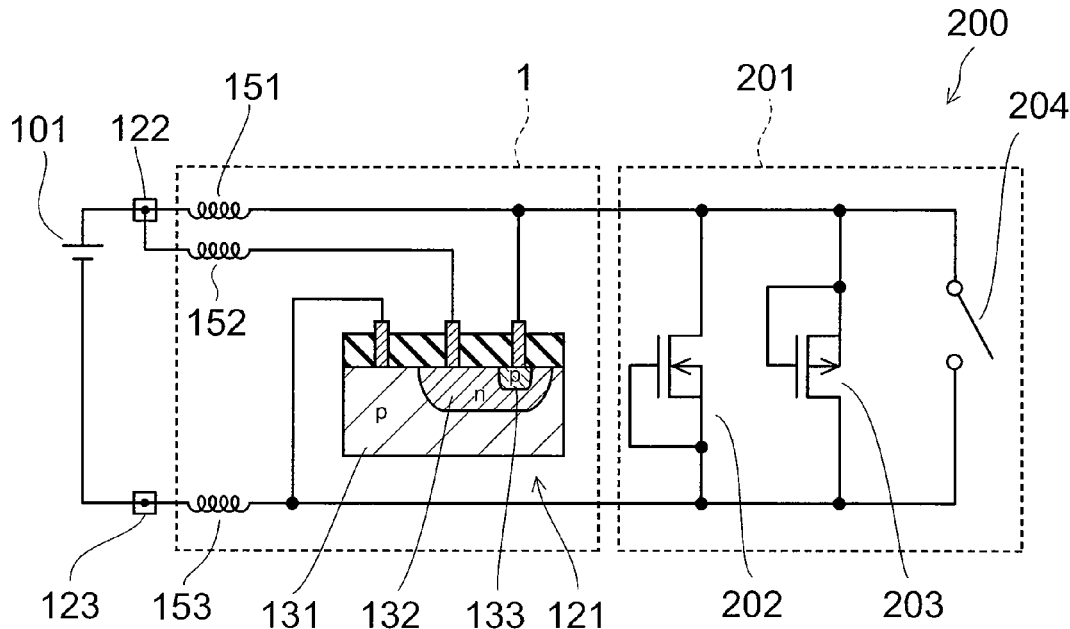
FIG. 5 is a schematic circuit diagram illustrating a semiconductor device according to a second embodiment.

FIG. 5 is a schematic circuit diagram illustrating a semiconductor device according to the embodiment.

As illustrated in FIG. 5, in the embodiment, a protected circuit 201 and the protective element 1 are provided in a semiconductor device 200. The configuration of the protective element 1 is the same as that of the first embodiment that was described previously. In the protected circuit 201, an n-channel type MOSFET (metal-oxide-semiconductor field effect transistor) 202, a p-channel type MOSFET 203, and a switching element 204 are connected in parallel between the high voltage side power supply voltage and the low voltage side power supply voltage.

Next, the operation and effect of the embodiment will be explained.

First, the simulation results of a working example of the embodiment are described.

Figure 6:
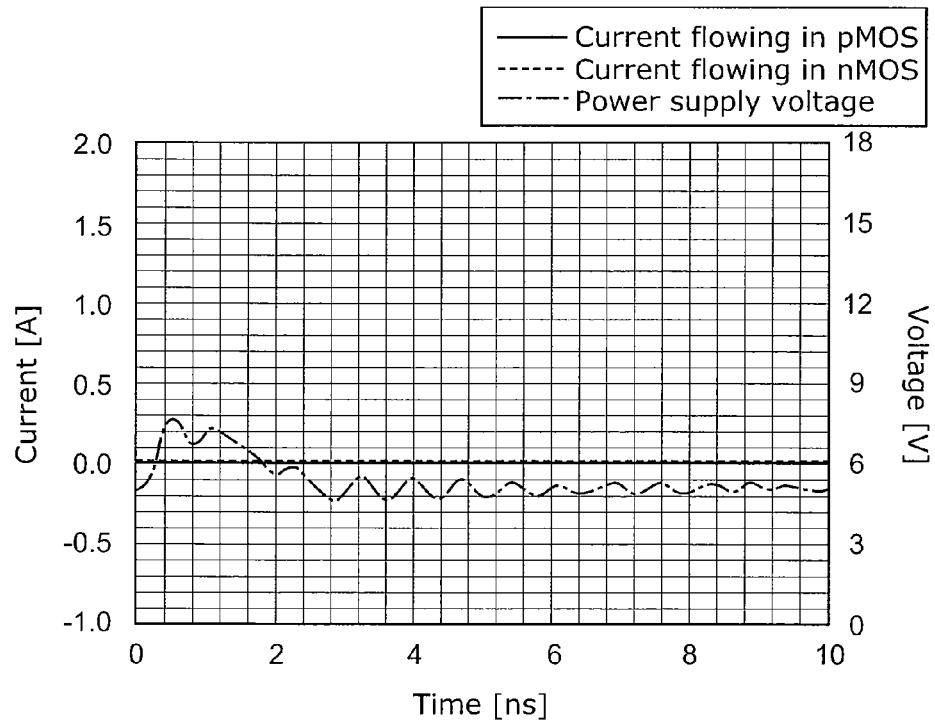
FIG. 6 is a graph showing simulation results, with time on the horizontal axis, and a voltage between a power supply interconnect of the protected circuit and a current flowing in a p-channel type MOSFET and an n-channel type MOSFET on the vertical axis.
Figure 7:
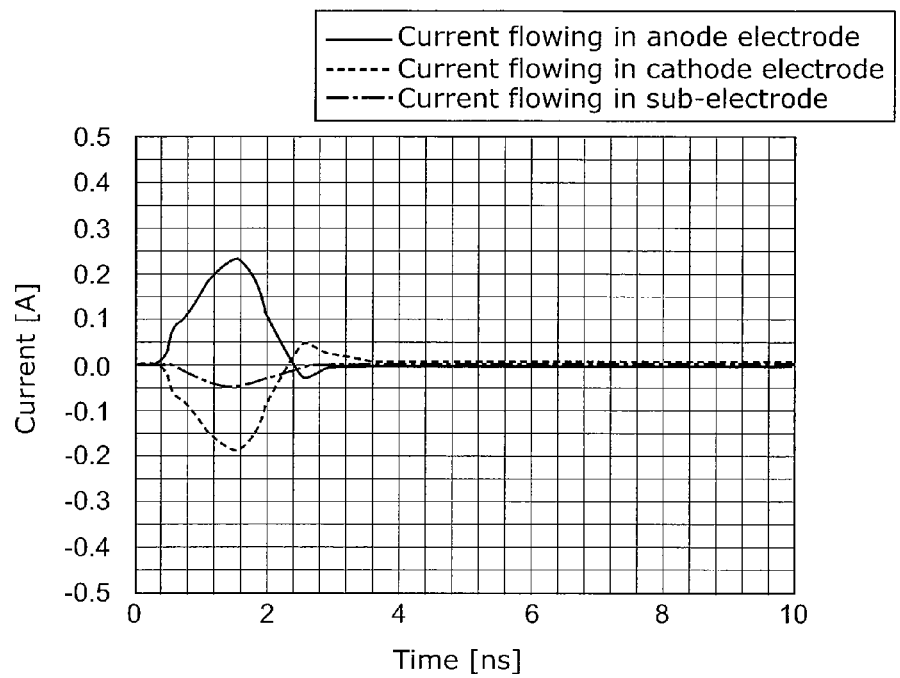
FIG. 7 is a graph showing simulation results for the protective element behavior, with time on the horizontal axis, and the current flowing in each electrode of the protective element on the vertical axis.

FIG. 6 is a graph showing the simulation results, with time on the horizontal axis, and the voltage between the power supply interconnect of the protected circuit and the current flowing in the p-channel type MOSFET (hereafter referred to as "pMOS") and the n-channel type MOSFET (hereafter referred to as the "nMOS") on the vertical axis, and FIG. 7 is a graph showing an example of the simulation results for the protective element behavior, with time on the horizontal axis, and the current flowing in each electrode of the protective element on the vertical axis.

In the simulation results shown in FIGS. 6 and 7, the voltage and current generated when the switching element 204 transitions from the on state to the off state were simulated. The output voltage of the external direct current power supply 101 was 5 V (volts), the magnitude of the current flowing in the power supply interconnect when the switching element 204 is in the on state was 3 A (Amperes), and the shutoff speed of the switching element 204 was 2 ns (nanoseconds).

As shown in FIG. 6, when the switching element 204 is shut off, the power supply voltage is increased by a maximum of about 2.5 V due to the inductance of the wire 151, but it returned to the original voltage (5 V) about 3 ns after start of shut off.

At this time, as shown in FIG. 7, a maximum current of about 0.25 A flowed in the anode electrode 136 of the protective element 1. Also, of this about 0.20 A current flowed in the cathode electrode 137 as the current $I_2$, and the remainder of about 0.05 A flowed in the sub-electrode 138 as the current $I_3$.

In this way, as shown in FIG. 6, the magnitudes of the currents flowing in the nMOS 202 and the pMOS 203 of the protected circuit 201 were virtually unchanged. Therefore it was possible to protect the nMOS 202 and the pMOS 203.

Next, the simulation results for a first comparative example of the second embodiment are described.

Figure 8:
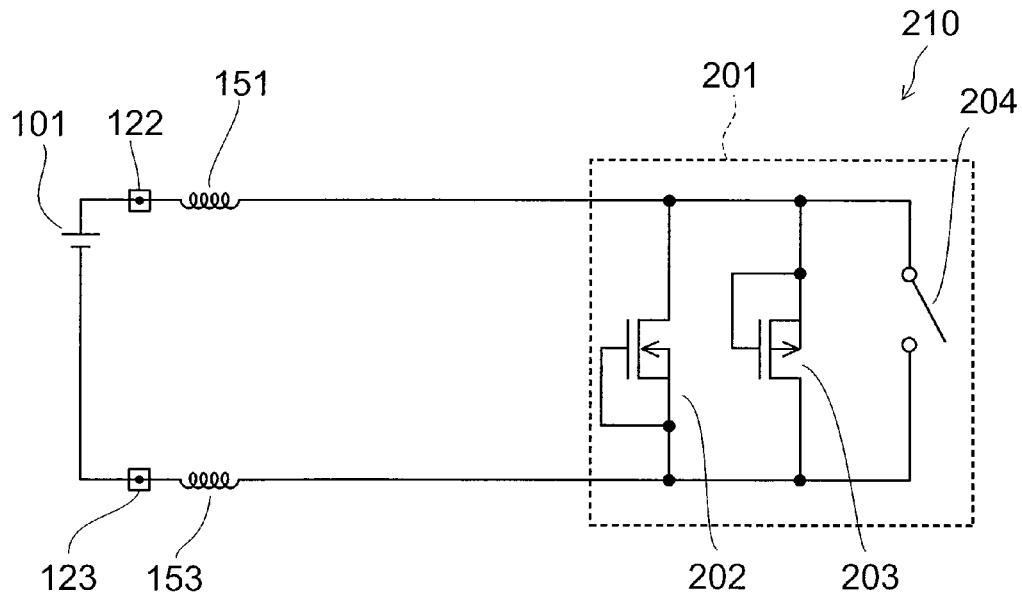
FIG. 8 is a schematic circuit diagram illustrating a semiconductor device according to a first comparative example of the second embodiment.
Figure 9:
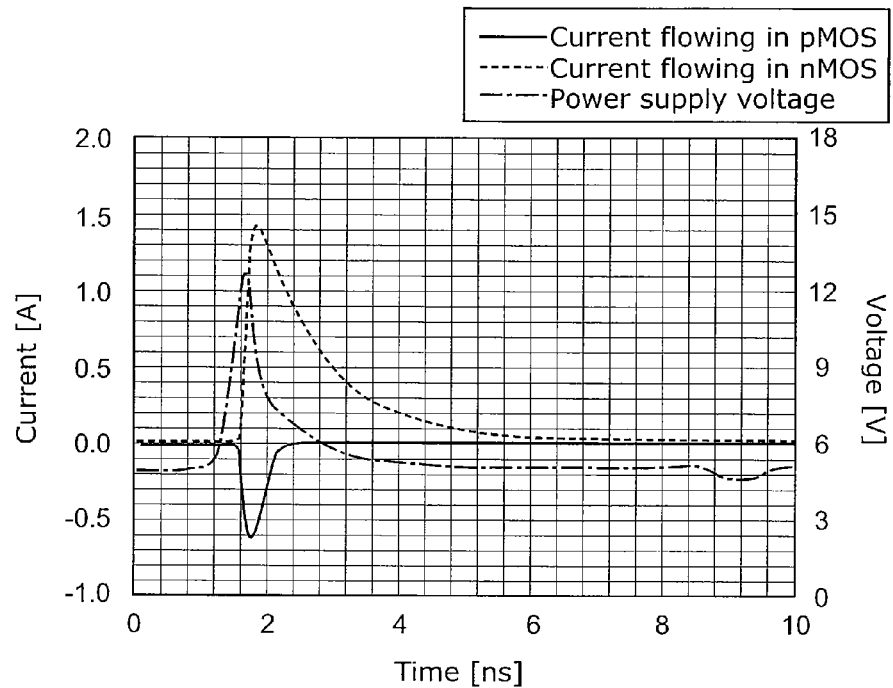
FIG. 9 is a graph showing simulation results, with time on the horizontal axis, and the voltage between a power supply interconnect of a protected circuit and a current flowing in a p-channel type MOSFET and an n-channel type MOSFET on the vertical axis.

FIG. 8 is a schematic circuit diagram illustrating a semiconductor device according to the comparative example, and FIG. 9 is a graph showing the simulation results, with time on the horizontal axis, and the voltage between the power supply interconnect of the protected circuit and the current flowing in the pMOS and the nMOS on the vertical axis.

As illustrated in FIG. 8, in a semiconductor device 210 according to the comparative example, the protective element 1 (see FIG. 5) is not provided, unlike the semiconductor device 200 according to the second embodiment (see FIG. 5). The same simulation was carried out for the semiconductor device 210 as for the second embodiment as described above.

As shown in FIG. 9, the power supply voltage increased by about 13 V due to the shut off of the switching element 204. Also, avalanche breakdown occurred in the nMOS 202 and about 1.4 A drain current flowed, and avalanche breakdown occurred in the pMOS 203 and about 0.6 A current flowed. In this way, the protective element 1 was not provided in the comparative example, and the protected circuit 201 was not sufficiently protected.

Next, a second comparative example of the second embodiment is explained.

Figure 10:
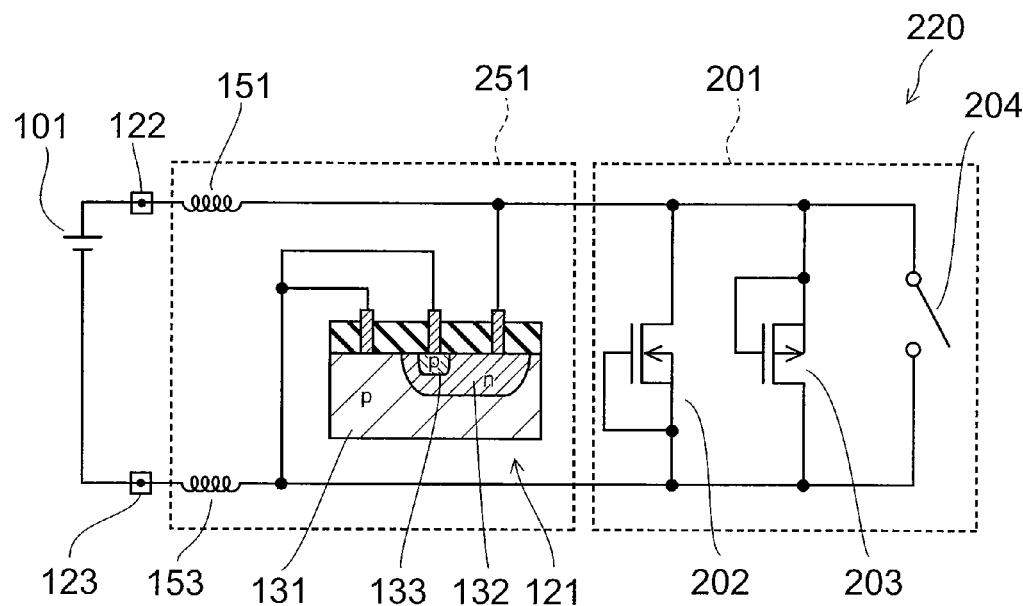
FIG. 10 is a schematic circuit diagram illustrating a semiconductor device according to a second comparative example of the second embodiment.

FIG. 10 is a schematic circuit diagram illustrating a semiconductor device according to the comparative example.

As illustrated in FIG. 10, in a semiconductor device 220 according to the comparative example, compared with the semiconductor device 200 according to the second embodiment, a protective element 251 is provided instead of the protective element 1 (see FIG. 5). In the protective element 251, similar to the protective element 1, the low voltage side power supply voltage is applied to the p-type well 131, and the high voltage side power supply voltage is applied to the n-type region 132, but unlike the protective element 1, the low voltage side power supply voltage is applied to the p-type region 133, not the high voltage side power supply voltage. Also, the withstand voltage of the protective element 251 is set lower than the withstand voltage of each element in the protected circuit 201.

In the comparative example, when a surge current is applied to the power supply interconnect due to an ESD or the like, avalanche breakdown occurs at the interface of the n-type region 132 and the p-type region 133 of the protective element 251, and the surge current flows. In this way, it is possible to protect the protected circuit 201. However, when the switching element 204 has transitioned from the on state to the off state, avalanche breakdown occurs at the interface of the n-type region 132 and the p-type region 133, and current flows. In this way, although the protected circuit 201 is protected, the protective element 251 is damaged. Also, when the switching element 204 is repeatedly turned on and off in a steady state manner, avalanche breakdown frequently occurs in the protective element 251, resulting in damage in a short period of time. In order to avoid this, it is possible to consider slowing the speed of transition between the on state and off state of the switching element 204, to reduce the rise in voltage between the power supply interconnect, but by doing this the operation efficiency of the semiconductor device 220 is reduced.

Also, in the comparative example, it is necessary to set the withstand voltage of the protective element 251 lower than the withstand voltage of each element of the protected circuit 201. Therefore, it would be necessary to either increase the size of each element in the protected circuit 201, or provide a resistance between the protective element 251 and the protected circuit 201 to divide the voltage of the power supply. As a result the semiconductor device 220 would become larger.

In contrast, according to the second embodiment, similar to the first embodiment that has been described previously, a surge current due to ESD or the like flows as a breakdown current between the n-type region 132 and the p-type well 131, and the spike current when the switching element 204 has transitioned from the on state to the off state flows as the forward current $I_2$ between the p-type region 133 and the n-type region 132, and the on current $I_3$ of the parasitic pnp transistor formed from the p-type region 133, the n-type region 132, and the p-type well 131. In this way it is possible to prevent degradation of the protective element 1 due to the on and off operation of the switching element 204, while protecting the protected circuit 201.

Next, a third embodiment will be described.

Figure 11:
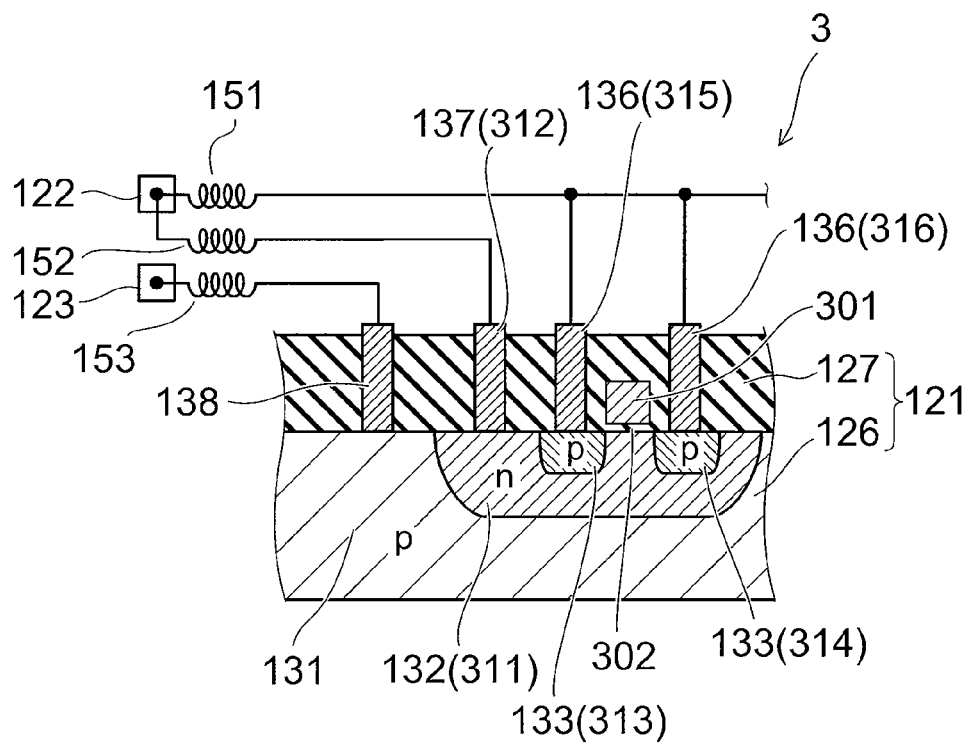
FIG. 11 is a schematic cross-sectional view illustrating a protective element according to a third embodiment.

FIG. 11 is a schematic cross-sectional view illustrating a protective element according to the embodiment.

As illustrated in FIG. 11, a protective element 3 according to the embodiment is formed using a pMOS structure. In other words, a pMOS back gate region 311 is used as the n-type region 132, and a pMOS back gate electrode 312 is used as the cathode electrode 137. Also, either one or both of a pMOS source region 313 and a drain region 314 are used as the p-type region 133, and either one or both a pMOS source electrode 315 and a drain electrode 316 are used as the anode electrode 136. A gate electrode 301 is provided in the region directly above a region between the source region 313 and the drain region 314, and a gate insulating film 302 is provided between the silicon substrate 126 and the gate electrode 301. However, the protective element 3 does not function as a pMOS, and the gate electrode 301 and the gate insulating film 302 of the pMOS are not actively used as constituent members of the protective element 3. For example, a pMOS (not shown on the drawings) is provided in a region separated from the protective element 3 in the integrated circuit die 121, and the protective element 3 is formed by the same pattern and the same process as the pMOS.

According to the embodiment, it is possible to form the protective element 3 by pMOS processes. Therefore there is no necessity to provide special processes to form the protective element 3, so it is possible to reduce the design cost and processing cost. The configuration, operation, and effect of the embodiment other than that described above is the same as the first embodiment as described previously.

Next, a fourth embodiment will be described.

Figure 12:
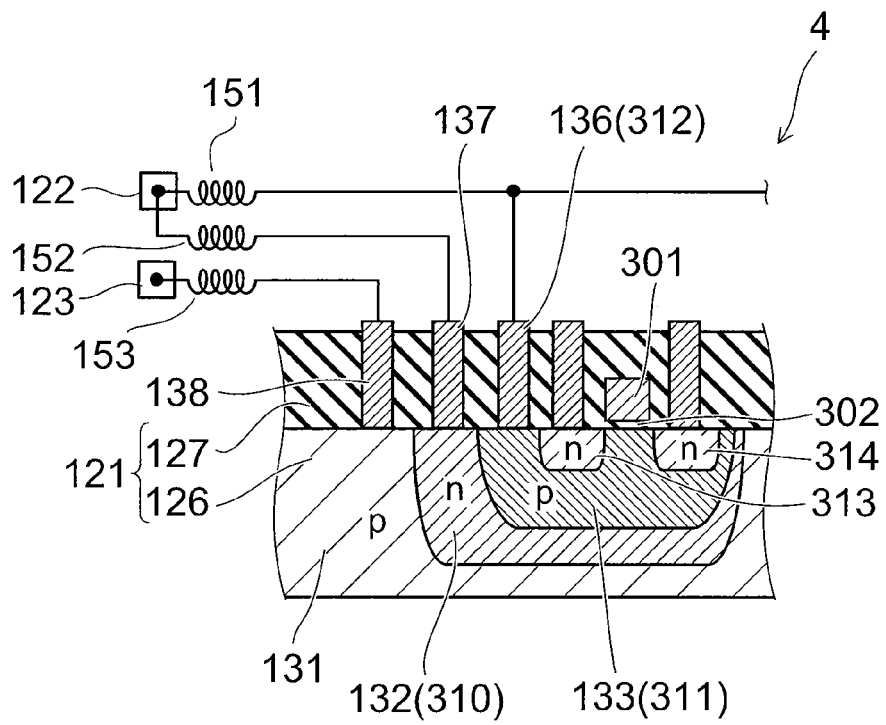
FIG. 12 is a schematic cross-sectional view illustrating a protective element according to a forth embodiment.

FIG. 12 is a schematic cross-sectional view illustrating a protective element according to the embodiment.

As illustrated in FIG. 12, a protective element 4 according to the embodiment is formed using an nMOS structure. In this nMOS structure, an n-type well 310 is formed in a portion of the top layer part of the p-type well 131, the p-type back gate region 311 is formed in a portion of the top layer part of the n-type well 310, and the n-type source region 313 and the drain region 314 are formed in a portion of the top layer part of the back gate region 311. The gate electrode 301 is provided in the region directly above the region between the source region 313 and the drain region 314, and the gate insulating film 302 is provided between the silicon substrate 126 and the gate electrode 301.

Also, the nMOS n-type well 310 is used as the n-type region 132 of the protective element 4, an electrode connected to the n-type well 310 is used as the cathode electrode 137, the nMOS back gate region 311 is used as the p-type region 133, and the nMOS back gate electrode 312 is used as the anode electrode 136. The protective element 4 does not function as an nMOS, and the source region 313, drain region 314, gate electrode 301, and gate insulating film 302 are not actively used as constituent members of the protective element 4. For example, an nMOS (not shown on the drawings) is provided in a region separated from the protective element 4 in the integrated circuit die 121, and the protective element 4 is formed by the same pattern and the same process as the nMOS.

According to the embodiment, it is possible to form the protective element 4 by nMOS processes. Therefore there is no necessity to provide special processes to form the protective element 4, so it is possible to reduce the design cost and processing cost. The configuration, operation and effect of the embodiment other than that described above is the same as the first embodiment as described previously.

Next, a fifth embodiment will be described.

Figure 13:
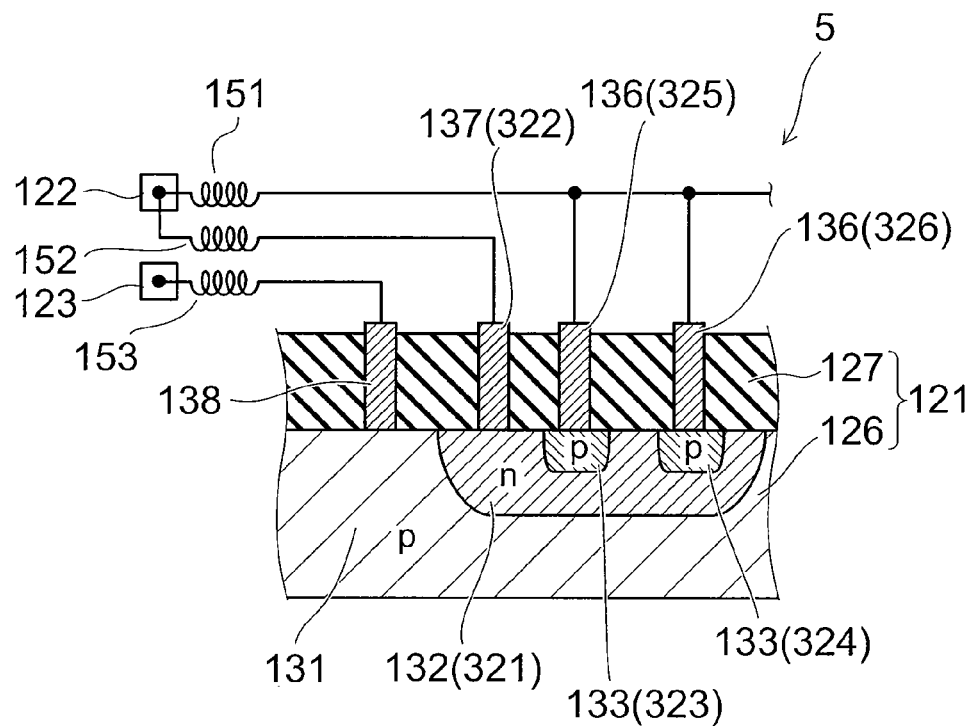
FIG. 13 is a schematic cross-sectional view illustrating a protective element according to a fifth embodiment.

FIG. 13 is a schematic cross-sectional view illustrating a protective element according to the embodiment.

As illustrated in FIG. 13, a protective element 5 according to the embodiment is formed using a pnp transistor structure. In other words, a base region 321 of the pnp transistor is used as the n-type region 132, and a base electrode 322 of the pnp transistor is used as the cathode electrode 137. Also, either one or both of a collector diffusion layer 323 of the pnp transistor and an emitter diffusion layer 324 are used as the p-type region 133, and either one of both of a collector electrode 325 and an emitter electrode 326 of the pnp transistor are used as the anode electrode 136. The protective element 5 does not function as a pnp transistor. For example, a pnp transistor (not shown on the drawings) is provided in a region separated from the protective element 5 in the integrated circuit die 121, and the protective element 5 is formed by the same pattern and the same process as the pnp transistor.

According to the embodiment, it is possible to form the protective element 5 by pnp transistor processes. Therefore there is no necessity to provide special processes to form the protective element 5, so it is possible to reduce the design cost and processing cost. The configuration, operation and effect of the embodiment other than that described above is the same as the first embodiment as described previously.

Next, a sixth embodiment will be explained.

Figure 14:
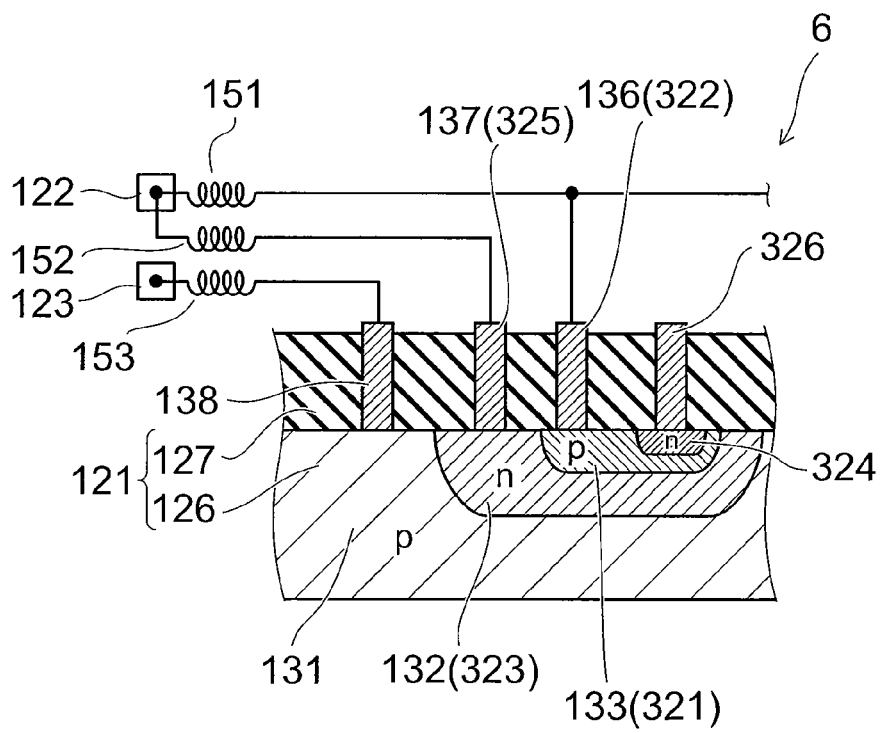
FIG. 14 is a schematic cross-sectional view illustrating a protective element according to a sixth embodiment.

FIG. 14 is a schematic cross-sectional view illustrating a protective element according to the embodiment.

As illustrated in FIG. 14, a protective element 6 according to the embodiment is formed using an npn transistor structure. In other words, a collector diffusion layer 323 of the npn transistor is used as n-type region 132, and a collector electrode 325 of the npn transistor is used as the cathode electrode 137. Also, a base region 321 of the npn transistor is used as the p-type region 133, and a base electrode 322 of the npn transistor is used as the anode electrode 136. An emitter diffusion layer 324 is provided in a portion of the top layer part of the base region 321, and an emitter electrode 326 is connected to the emitter diffusion layer 324. The protective element 6 does not function as an npn transistor, and the emitter diffusion layer 324 and the emitter electrode 326 are not actively used as constituent members of the protective element 6. For example, an npn transistor (not shown on the drawings) is provided in a region separated from the protective element 6 in the integrated circuit die 121, and the protective element 6 is formed by the same pattern and the same process as the npn transistor.

According to the embodiment, it is possible to form the protective element 6 by npn transistor processes. Therefore there is no necessity to provide special processes to form the protective element 6, so it is possible to reduce the design cost and processing cost. The configuration, operation and effect of the embodiment other than that described above is the same as the first embodiment as described previously.

Next, a seventh embodiment will be explained.

Figure 15:
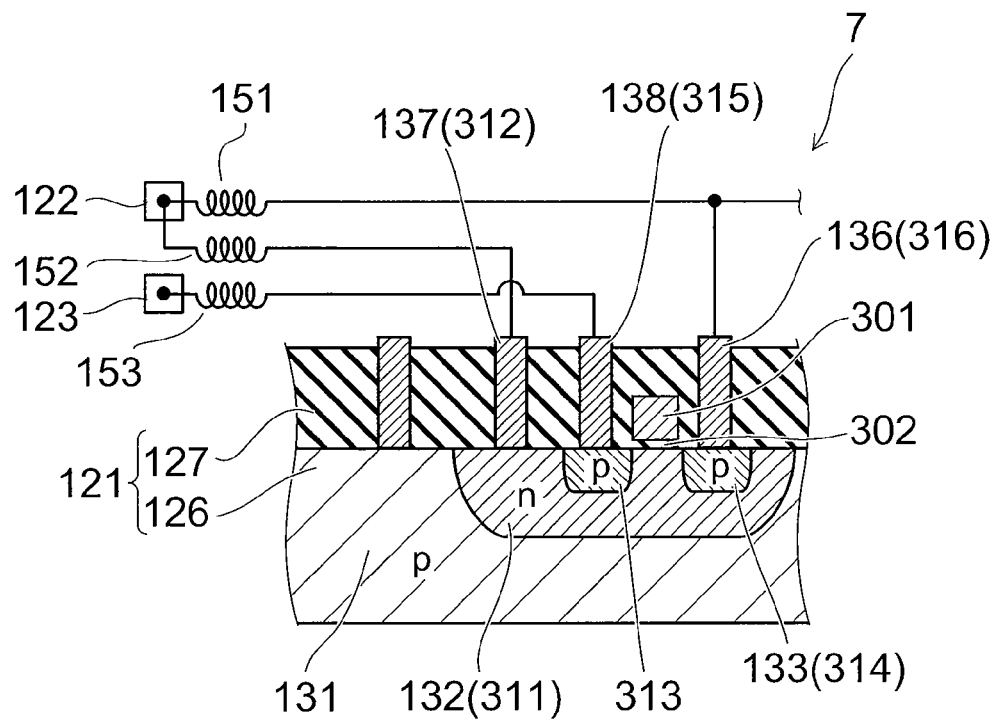
FIG. 15 is a schematic cross-sectional view illustrating a protective element according to a seventh embodiment.

FIG. 15 is a schematic cross-sectional view illustrating a protective element according to the embodiment.

As illustrated in FIG. 15, compared with the protective element 3 (see FIG. 11) according to the third embodiment, a protective element 7 according to the embodiment differs in that it uses only one of the source electrode 315 and the drain electrode 316 of the pMOS as the anode electrode 136, and uses the other of the source electrode 315 and the drain electrode 316 as the sub-electrode 138. In the example illustrated in FIG. 15, the drain electrode 316 is used as the anode electrode 136, and the source electrode 315 is used as the sub-electrode 138. The source electrode 315 is used as the anode electrode 136, and the drain electrode 316 is used as the sub-electrode 318. In the embodiment, the p-type well 131 is not actively used as a constituent member of the protective element 7.

In the protective element 7 according to the embodiment, the current $I_2$ indicated in FIG. 4B flows as a forward current of the parasitic pn diode formed from the p-type drain region 314 and the n-type back gate region 311, the current $I_3$ indicated in FIG. 4B flows as the on current of a parasitic transistor formed from the p-type drain region 314, the n-type back gate region 311, and the p-type source region 313, and the current $I_4$ indicated in FIG. 4C flows as the breakdown current of the parasitic pn diode formed from the n-type back gate region 311 and the p-type source region 313.

According to the embodiment, the currents $I_2$, $I_3$, and $I_4$ do not flow out from the back gate region 311, and the energy due to the inductance of the wire 151 or ESD is not discharged through parts in the silicon substrate 126 other than the protective element 7, so it is possible to prevent the malfunctioning of other elements (not illustrated on the drawings) provided in the integrated circuit die 121. The configuration, operation and effect of the embodiment other than that described above is the same as the third embodiment as described previously.

Next, an eighth embodiment will be explained.

Figure 16:
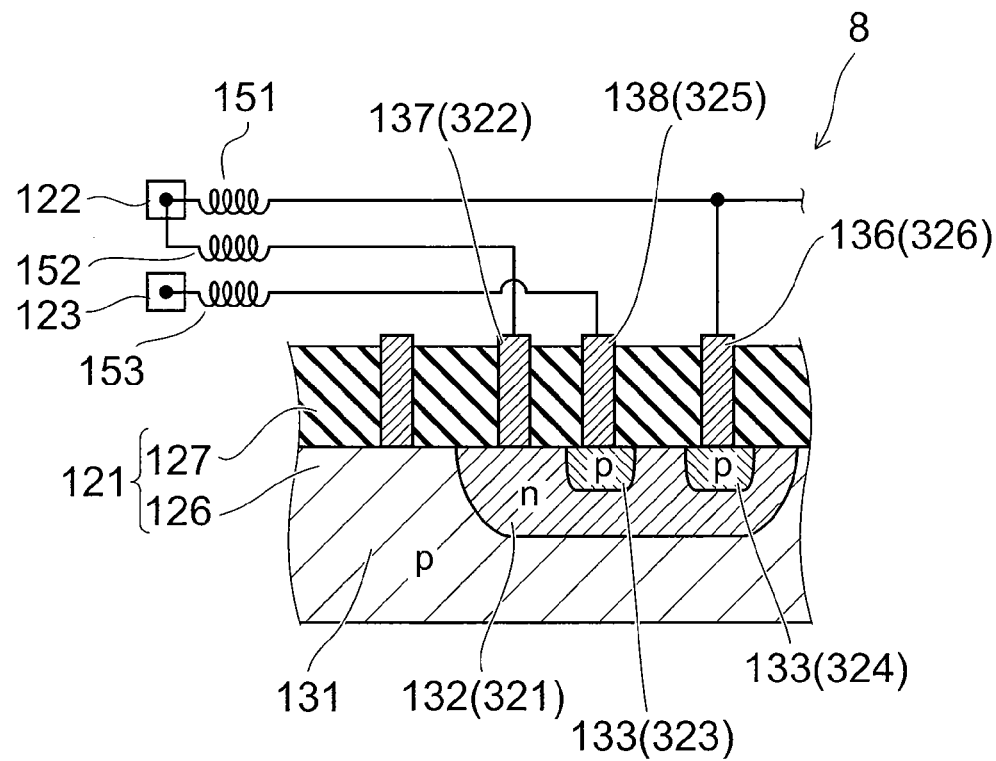
FIG. 16 is a schematic cross-sectional view illustrating a protective element according to an eighth embodiment.

FIG. 16 is a schematic cross-sectional view illustrating a protective element according to the embodiment.

As illustrated in FIG. 16, compared with the protective element 5 (see FIG. 13) according to the fifth embodiment, a protective element 8 according to the embodiment differs in that it uses only one of the collector electrode 325 and the emitter electrode 326 of the pnp transistor as the anode electrode 136, and uses the other of the collector electrode 325 and the emitter electrode 326 as the sub-electrode 138. In the example illustrated in FIG. 16, the emitter electrode 326 is used as the anode electrode 136, and the collector electrode 325 is used as the sub-electrode 138. The collector electrode 325 may be used as the anode electrode 136, and the emitter electrode 326 may be used as the sub-electrode 318. In the embodiment, the p-type well 131 is not actively used as a constituent member of the protective element 8.

In the protective element 8 according to the embodiment, the current $I_2$ as indicated in FIG. 4B flows as a forward current of the parasitic pn diode formed from the p-type emitter diffusion layer 324 and the n-type base region 312, the current $I_3$ indicated in FIG. 4B flows as the on current of a parasitic transistor formed from the p-type emitter diffusion layer 324, the n-type base region 321, and the p-type collector diffusion layer 323, and the surge current $I_4$ indicated in FIG. 4C flows as the breakdown current of the parasitic pn diode formed from the n-type base region 321 and the p-type collector diffusion layer 323.

According to the embodiment, the currents $I_2$, $I_3$, and $I_4$ do not flow out from the base region 321, and the energy due to the inductance of the wire 151 or ESD is not discharged through parts in the silicon substrate 126 other than the protective element 8, so it is possible to prevent faulty operation of other elements (not illustrated on the drawings) provided in the integrated circuit die 121. The configuration, operation and effect of the embodiment other than that described above is the same as the fifth embodiment as described previously.

In the seventh embodiment, the protective element 7 need not have a pMOS structure, and in the eighth embodiment the protective element 8 need not have a pnp transistor structure. In other words, an n-type region may be formed in the silicon substrate 126, two mutually isolated p-type regions may be formed in this n-type region, the anode electrode 136 may be connected to one of these p-type regions, and the sub-electrode 138 may be connected to the other p-type region, and the cathode electrode 137 may be connected to the n-type region. In other words, a first p-type region, which is connected to first interconnect to which the high voltage side power supply voltage is applied and through which the current supplied to the protected circuit flows, and a second p-type region, to which the low voltage side power supply voltage is applied, may be surrounded by an n-type region connected to second interconnect to which the high voltage side power supply voltage is applied and through which the current supplied to the protected circuit does not flow. In this way the current does not leak out of the n-type region, and it is possible to prevent malfunction of other elements provided in the integrated circuit die 121 due to this current. Preferably this n-type region is surrounded by another p-type region, for example a p-type well or a p-type substrate. In this way it is possible to more reliably prevent leakage of the current out of the n-type region.

Also, in each of the embodiments as described above, examples were described in which the wire 151 and the wire 152 were connected to the same lead pin 122, but there is no limitation to this, and the wire 151 and the wire 152 may be connected to different lead pins or to other conductive members. However, it is necessary that under steady state conditions the same voltage is applied to the wire 151 and the wire 152. Also, it is necessary that current that is supplied to the protected circuit flows through the wire 151, and current that is supplied to the protected circuit does not flow through the wire 152.

According to the embodiments as explained above, it is possible to realize a highly durable semiconductor device and DC-DC converter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device comprising:
a first interconnect configured to connect a high voltage side power supply voltage;
a second interconnect separate from the first interconnect, configured to connect the high voltage side power supply voltage;
a switching transistor with a first end connected to the first interconnect, and a second end connected to an output terminal; and
a protective element connected in parallel with the switching transistor between the high voltage side power supply voltage and a low voltage side power supply voltage, the protective element including:
a first p-type semiconductor region connected to the first interconnect;
an n-type semiconductor region in contact with the first p-type semiconductor region and connected to the second interconnect; and
a second p-type semiconductor region in contact with the n-type semiconductor region, spaced from the first p-type semiconductor region, and connected to a third interconnect configured to connect the low voltage side power supply voltage.

2. The device according to claim 1, wherein the first interconnect is connected to a common lead pin via a first bonding wire and the second interconnect is connected to the common lead pin via a second bonding wire.

3. The device according to claim 1, wherein
the first p-type region is surrounded by the n-type region, and
the n-type region is surrounded by the second p-type region.

4. The device according to claim 1, wherein the first and second p-type regions are surrounded by the n-type region.

5. The device according to claim 4, further comprising a third p-type region that surrounds the n-type region.

6. A DC-DC converter comprising:
a first interconnect connected to a high voltage side power supply voltage;
a second interconnect separate from the first interconnect, connected to the high voltage side power supply voltage;
a switching circuit connected between the high voltage side power supply voltage and a low voltage side power supply voltage via the first interconnect, that selectively connects the high voltage side power supply voltage and the low voltage side power supply voltage to an output terminal;
an inductor with a first end connected to the output terminal of the switching circuit;
a capacitor connected between a second end of the inductor and the low voltage side power supply voltage; and
a protective element connected in parallel with the switching circuit between the high voltage side power supply voltage and the low voltage side power supply voltage, the protective circuit including:
a first p-type semiconductor region connected to the first interconnect;
an n-type semiconductor region in contact with the first p-type semiconductor region and connected to the second interconnect; and
a second p-type semiconductor region in contact with the n-type semiconductor region, spaced from the first p-type semiconductor region, and connected to the low voltage side power supply voltage.

7. The converter according to claim 6, wherein the first interconnect is connected to the high voltage side power supply voltage via a first wiring and the second interconnect is connected to the high voltage side power supply voltage via a second wiring.

8. A protective element connected in parallel with a protected circuit between a high voltage side power supply voltage and a low voltage side power supply voltage, comprising:
a first p-type region formed in a semiconductor substrate;
an n-type region formed in the semiconductor substrate, in contact with the first p-type region;
a second p-type region formed in the semiconductor substrate, in contact with the n-type region, spaced from the first p-type region, and to which the low voltage side power supply voltage is applied;
a first interconnect portion that is connected to the first p-type region, the high voltage side power supply voltage, and the protected circuit; and
a second interconnect portion, which is separate from the first interconnect portion, that is connected to the n-type region and the high voltage side power supply voltage.

9. The element according to claim 8, wherein the protected circuit includes a switching circuit that switches whether or not the high voltage side power supply voltage is connected to the low voltage side power supply voltage.

10. The element according to claim 9, wherein the protected circuit is a portion of a DC-DC converter.

11. The element according to claim 8, wherein the first and second interconnect includes wire.

12. The element according to claim 11, wherein the first interconnect and the second interconnect are connected to a common lead pin.

13. The element according to claim 8, wherein
the first p-type region is surrounded by the n-type region, and
the n-type region is surrounded by the second p-type region.

14. The element according to claim 8, wherein the first and second p-type regions are surrounded by the n-type region.

15. The element according to claim 14, further comprising a third p-type region that surrounds the n-type region, formed in the semiconductor substrate.

16. The element according to claim 8, wherein
the first interconnect portion is connected to the high voltage side power supply voltage via a first inductance portion, and
the second interconnect portion is connected to the high voltage side power supply voltage without the first inductance portion forming a part of the connection between the second interconnect portion and the high voltage side power supply voltage.

17. The element according to claim 16, wherein the first interconnect portion and the second interconnect portion are connected to a common lead pin to which the high voltage side power supply voltage is applied.

18. The element according to claim 17, wherein the second interconnect portion is connected to the high voltage side power supply voltage via a second inductance portion.

19. The element according to claim 8, wherein
the first interconnect portion is connected to the high voltage side power supply voltage via a first bonding wire, and
the second interconnect portion is connected to the high voltage side power supply voltage via a second bonding wire without the first bonding wire forming a part of the connection between the second interconnect portion and the high side power supply voltage.

20. The element according to claim 8, wherein
the high voltage side power supply voltage is applied to the first interconnect portion, and current that is supplied to the protected circuit flows through the first interconnect portion, and
the high voltage side power supply voltage is applied to the second interconnect portion, and the current that is supplied to the protected circuit does not flow through the second interconnect portion.

* * * * *